US012567464B2

(12) United States Patent
Huang et al.

(10) Patent No.: US 12,567,464 B2
(45) Date of Patent: Mar. 3, 2026

(54) METHOD FOR IMPLEMENTING CONTENT-ADDRESSABLE MEMORY BASED ON AMBIPOLAR FET

(71) Applicant: PEKING UNIVERSITY, Beijing (CN)

(72) Inventors: Ru Huang, Beijing (CN); Weikai Xu, Beijing (CN); Jin Luo, Beijing (CN); Qianqian Huang, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 177 days.

(21) Appl. No.: 18/715,959

(22) PCT Filed: Apr. 24, 2023

(86) PCT No.: PCT/CN2023/090200
§ 371 (c)(1),
(2) Date: Jun. 3, 2024

(87) PCT Pub. No.: WO2024/060611
PCT Pub. Date: Mar. 28, 2024

(65) Prior Publication Data
US 2025/0029657 A1 Jan. 23, 2025

(30) Foreign Application Priority Data
Sep. 22, 2022 (CN) .......................... 202211155145.X

(51) Int. Cl.
*G11C 15/04* (2006.01)
(52) U.S. Cl.
CPC .................................. *G11C 15/046* (2013.01)

(58) Field of Classification Search
CPC ...................................................... G11C 15/046
USPC ...................................................... 365/49.17
See application file for complete search history.

(56) References Cited

U.S. PATENT DOCUMENTS

| | | | | |
|---|---|---|---|---|
| 2010/0226161 A1* | 9/2010 | Ji | .......................... | G11C 15/046 365/49.1 |
| 2020/0144293 A1* | 5/2020 | Majhi | .................. | H10D 64/033 |
| 2022/0148636 A1* | 5/2022 | Lu | .......................... | G11C 15/046 |

FOREIGN PATENT DOCUMENTS

| | | |
|---|---|---|
| CN | 114743578 A | 7/2022 |
| CN | 114758695 A | 7/2022 |
| CN | 114898788 A | 8/2022 |
| CN | 115472194 A | 12/2022 |

* cited by examiner

*Primary Examiner* — Anthan Tran
*Assistant Examiner* — Duy H Luong
(74) *Attorney, Agent, or Firm* — Bret E. Field; Bozicevic, Field & Francis LLP

(57) ABSTRACT

Disclosed is a method for implementing a content address-able memory based on an ambipolar FET, wherein a linear non-separable comparison operation required for a CAM cell is realized based on a single ambipolar FET with a threshold voltage through interposing a memory layer between a gate dielectric layer and a control gate of the ambipolar FET in source/drain symmetry to modulate the threshold voltage for information storage and through utilizing its non-monotonic transfer characteristics for input search.

5 Claims, 1 Drawing Sheet

METHOD FOR IMPLEMENTING CONTENT-ADDRESSABLE MEMORY BASED ON AMBIPOLAR FET

CROSS-REFERENCE TO RELATED APPLICATIONS

This application is a U.S. National Phase Application under 35 U.S.C. 371 of International Application No. PCT/CN2023/090200 filed on Apr. 24, 2023, which claims the benefit of Chinese Patent Application No. 202211155145X filed on Sep. 22, 2022. The entire disclosures of the above applications are expressly incorporated by reference herein.

FIELD OF THE INVENTION

The present disclosure relates to a field of novel storage and computing technology, and in particular, to a content-addressable memory design based on an ambipolar FET.

BACKGROUND OF THE INVENTION

A content-addressable memory (CAM) performs a search operation efficiently and in parallel, and has been widely used in efficient machine learning models such as routers, database search, processing in memory, and neuromorphic computing. CAM is a special type of memory for parallel searching, and can perform a unique search operation in addition to the read and write operations of a conventional memory. CAM is originally used to accelerate table lookup operations for packet forwarding sorting, and so on in network routers. Since CAM can complete the entire search operation in a single clock cycle, significant acceleration effects are exhibited compared to other hardware- or software-based search systems, and may be further emphasized with the transition from Internet Protocol version 4 (IPv4) to Internet Protocol version 6 (IPv6) or higher. In the era of big data, CAM is extremely attractive in processing edge-side machine learning tasks such as pattern match, video and image processing, etc., due to its ability that complete the matching operation between an input vector (query) and all of stored vectors (entries) in a single search cycle and perform feature retrieval in terms of distance metric based on the degree of mismatch.

CAM designs based on a conventional static random access memory (SRAM) may occupy a large cell area, limiting its storage density for computationally intensive algorithm mapping, and the resulting large parasitic capacitance further increasing search latency and power consumption. CAMs designed based on various emerging nonvolatile memories, such as resistive random access memory (RRAM), phase change memory (PCM), and ferroelectric field effect transistors (FeFET), have reduced cell area, as well as search latency and power consumption. However, since all the above CAMs are implemented by utilizing conventional metal-oxide-semiconductor field effect transistors (MOSFETs) as the logic transistors for controlling the search, their monotonous transfer characteristic curves lead to the design of CAMs based on a circuit topology of two complementary branching paths for storing two states of entries, by which a linear non-separable comparison operation between an input query and stored entries is further realized, which inevitably leads to the reduction of cell area, as well as search delay and energy consumption. The comparison operation between the input query and the stored entries, which inevitably brings about an increase in hardware cost.

According to the switching characteristics and the dominant carriers in the semiconductor, FETs may be classified into unipolar (hole-dominated p-type or electron-dominated n-type) and ambipolar (where both holes and electrons are involved in the conductivity) FETs, where the ambipolar FETs exhibit non-monotonous transfer characteristic curves. In recent years, a variety of semiconductor materials with ambipolar conductivity and special structural designs have been used to implement the ambipolar FETs, providing new ideas for implementing more compact CAM designs with a simpler operation.

SUMMARY OF THE INVENTION

For the above existing problems in the prior arts, the present disclosure proposes a method for implementing a CAM based on an ambipolar FET. Compared with a CAM design based on a conventional MOSFET, the present disclosure breaks through the restriction by the need for a circuit topology of two complementary branching paths. The linear non-separable comparison operation required for a CAM cell can be realized in a single ambipolar FET with a modulatable threshold voltage, with smaller cell area and a simpler process of programming and searching operations, leading to higher search energy efficiency.

The technical solution of the present disclosure is provided as follows:

A method for implementing a CAM based on an ambipolar FET, characterized by using a semiconductor material with ambipolar conductive characteristics of electrons and holes as a channel, or a metal or metal silicide as a source/drain material, so that the FET with a source/drain-symmetric structure exhibits non-monotonic ambipolar transfer characteristics:

interposing a memory layer between a gate dielectric layer and a control gate of the ambipolar FET, where the memory layer uses a floating gate/charge trapping layer and a tunneling dielectric layer to modulate a threshold voltage of the transistor through trapping/de-trapping charges in the semiconductor channel, or uses a layer of a ferroelectric material to modulate the threshold voltage of the transistor by switching a polarization state of the ferroelectric material, so that the ambipolar FET with a modulatable threshold voltage, represented as AMFET, is formed:

3) forming the CAM cell with the AMFET obtained in step 2):

4) wherein a drain and a gate of the AMFET are used as a ML terminal and a SL terminal of the CAM, respectively, and a source of the AMFET is grounded, wherein in a stage of performing write on the CAM cell to store an entry, the ML terminal is grounded, and programming or erasing voltage pulses are applied to the SL terminal to modulate the threshold voltage of the AMFET by charge trapping/de-trapping or ferroelectric polarization switching, so that a translation along a gate voltage is exhibited on a transfer characteristic curve of the device, where the gate voltage corresponding to a minimum drain current is called $V_{OFF}$, and corresponding $V_{OFF0}$ and $V_{OFF1}$ after a programming/erasing operation represent storing of entry 0 and entry 1, respectively: and in a searching operation, DC voltage biases of $V_{SL0}$ ($=V_{OFF0}$) and $V_{SL1}$ ($=V_{OFF1}$) are applied, representing imputing of query 0 and query 1, respectively, to the SL terminal and a fixed read voltage is applied to the ML terminal to determine a matching result by detecting a current of the ML terminal, where only when the input query is identical to the stored entries, the AMFET is in a turn-off state with a lower drain current, indicating match, and when the input query is not identical to the stored entries, the AMFET is in a turn-on state with a higher drain current, indicating mismatch, then the searching operation and the matching operation of a CAM cell is completed;

5) For a CAM array, each row of CAM cells in the array shares a ML, where a corresponding search voltage is applied to all of the SL terminals at the same time according to an input vector of the query, and each of rows of MLs for the CAM array has a different magnitude of current according to various mismatch situations between the input vector of query and stored vectors of entries, the magnitude of which is proportional to a degree of the mismatch, and a distance metric is realized according to the magnitude of this current.

In summary, using the non-monotonic transfer characteristics of the ambipolar FET and modulation of the threshold voltage by charge trapping or ferroelectric polarization switching, the linear non-separable comparison operation required for a CAM cell can be realized in the single AMFET and the distance metrics may be further achieved based on a CAM array according to a degree of mismatch, realizing a wider range of applications.

The present disclosure proposes a CAM design based on an ambipolar FET with a modulatable threshold voltage, wherein the AMFET has a source/drain-symmetric structure similar to that of a conventional MOSFET, which can have ambipolar characteristics by using a semiconductor material with ambipolar conductive characteristics of electrons and holes, as a channel, based on an organic small molecule (such as Diketopyrrolopyrrole, Naphthalimide derivative derivatives, etc.), a polymer (such as P (NDI$_2$ OD-T$_2$), etc.), a two-dimensional material (such as grapheme, Tungsten disulfide, black phosphorus, etc.), an oxide (such as tin oxide, etc.), and an organic-inorganic hybrid material (such as hybridized chalcogenides, etc.); or may also be a silicon-based Schottky barrier FET by using metal, metal silicides or the like as source and drain materials.

The present disclosure proposes a CAM design based on an ambipolar FET with a modulatable threshold voltage, wherein the writing of the stored entry may be achieved by interposing a memory layer between a gate dielectric layer and a control gate, a threshold voltage of the transistor may be modulated through trapping/de-trapping charges in the semiconductor channel, or switching the polarization state of a ferroelectric material, wherein the ferroelectric material may be of various types of HfO$_2$-doped ferroelectric materials such as HfO$_2$ doped with Zr (HZO), HfO$_2$ doped with Al (HfAlO), or conventional ferroelectric materials such as a chalcocite-type ferroelectric (such as PZT, BFO, SBT) or a ferroelectric polymer (such as P (VDF-TrFE)), and a gate stack of the device may be based on a variety of structures, such as MFMIS, MFIS, MFS and so on.

The present disclosure offer technical effects as follows:

1. The CAM design based on an ambipolar FET with a modulatable threshold voltage proposed in the present disclosure breaks through the restriction of the conventional MOSFET-based CAM design with two complementary branching paths, by utilizing the non-monotonic transfer characteristics. It realizes the complete function of the CAM cell based on a single transistor, reducing the hardware cost, and accordingly resulting in the reduction of parasitic effects on ML and SL, and further improving the search energy efficiency.

2. The CAM design based on an ambipolar FET with a modulatable threshold voltage proposed in the present disclosure can further reduce the complexity of programming and searching as well as the energy consumption, in which at least two memory elements needs to be programmed in each cell, and a voltage needs to be applied to two SLs in the searching as well, with a very significant advantage over the CAM design based on a conventional MOSFET.

DETAILED DESCRIPTION OF THE EMBODIMENTS

The present disclosure is hereinafter further clearly and completely described by means of specific embodiments in conjunction with the accompanying drawings.

Figure 1:
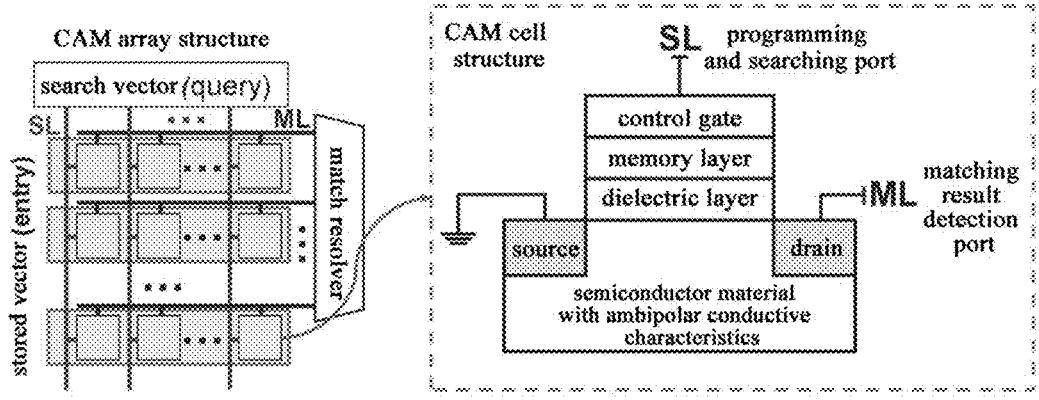
FIG. 1 shows a schematic diagram illustrating a CAM cell structure and an array structure based on an ambipolar FET with a modulatable threshold voltage in accordance with the present disclosure.

The schematic diagram illustrating a CAM cell structure and an array structure based on an ambipolar FET with a modulatable threshold voltage is shown in FIG. 1. Taking a FET based on the semiconductor material with ambipolar conductive characteristics as an example, an ambipolar FET with a modulatable threshold voltage, represented as AMFET, is formed with a memory layer interposed between a gate dielectric layer and a control gate, where the memory layer may be a floating gate/charge trapping layer and the tunneling dielectric layer; or the AMFET is formed with a layer of ferroelectric material interposed between the gate dielectric layer and the control gate, and the threshold voltage may be modulated by switching the ferroelectric polarization state. The AMFET has a drain serving as a ML terminal of the CAM cell for detecting whether an input query matches with a stored entry in a searching operation: the AMFET has a gate serving as a SL terminal of the CAM cell, where the AMFET is programmed or erased by applying voltage pulses in a write operation to obtain a corresponding state of the stored entry, and the searching operation is performed by applying a DC voltage corresponding to the input query in the searching operation: and the AMFET has a source connected to the ground potential. A magnitude of a current $I_{ML}$ at the ML terminal is detected to determine whether the input query matches with the stored entries in a process of the searching, where if the $I_{ML}$ is lower than a reference threshold voltage in the process of the searching, it indicates match; otherwise, it indicates mismatch.

Figure 2:
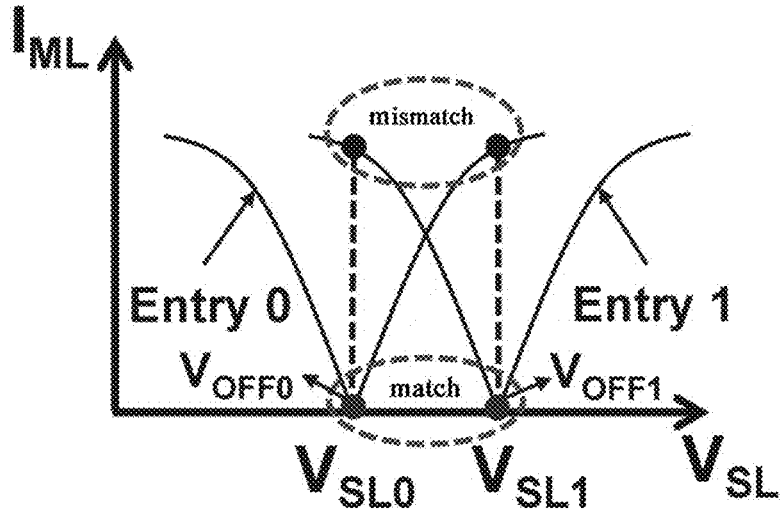
FIG. 2 shows a schematic diagram illustrating a functional implementation of a CAM cell based on an ambipolar FET with a modulatable threshold voltage in accordance with the present disclosure.

FIG. 2 shows a schematic diagram illustrating a functional implementation of the CAM cell based on the AMFET of this embodiment. When performing write on the CAM cell to store a state of an entry, an amount of trapped charges in the floating gate/charge trapping layer or a polarization state of a ferroelectric layer is changed or switched by applying different write voltage pulses to the SL terminal, so that $V_{OFF}$ of the AMFET goes to $V_{OFF0}$ and $V_{OFF1}$, respectively, representing storing of entry 0 and entry 1: and in a process of a searching, $V_{SL0}$ and $V_{SL1}$ are applied to the SL terminal, representing inputting of query 0 and query 1, respectively. When the input query and the stored entry are identical, then a search voltage at the SL terminal is equal to $V_{OFF}$, the AMFET is in a fully off state, and $I_{ML}$ is a lower off current of the device, indicating the match: and when the input query and the stored entry are not identical, the search voltage at the SL terminal the search voltage at the SL terminal may put the AMFET in an on state and $I_{ML}$ is a high on-state current of the device, indicating the mismatch. For the CAM array by a parallel search, since each row of CAM cells share the ML, a distance metric based on a degree of the mismatch may be further performed based on the magnitude of $I_{ML}$, which is proportional to a number of the stored entry vectors in each row mismatch with the input query vector.

This embodiment describes completely and detailedly the principle and manner of implementing a CAM based on a single AMFET, with a significantly lower hardware cost, a simpler operation and higher search energy efficiency, compared with a CAM design based on conventional MOSFET.

Finally, it should be noted that the disclosure of the embodiments is intended to assistant in the further understanding of the present disclosure, but those skilled in the art may understand that various substitutions and modifications are possible without departing from the spirit and scope of the present disclosure and the appended claims. Therefore, the present disclosure should not be limited to what is disclosed in the embodiments, and what is claimed by the present invention is subject to the scope defined in the claims.

What is claimed is:

1. A method for implementing a CAM based on an ambipolar FET, characterized by 1) using a semiconductor material with ambipolar conductive characteristics of electrons and holes as a channel, or a metal or metal silicide as a source/drain material, so that the FET with a source/drain-symmetric structure exhibits a non-monotonic ambipolar transfer characteristics;

2) interposing a memory layer between a gate dielectric layer and a control gate of the ambipolar FET, wherein the memory layer uses a floating gate/charge trapping layer and a tunneling dielectric layer to modulate a threshold voltage of the transistor through trapping/de-trapping charges in the semiconductor channel, or uses a layer of a ferroelectric material to modulate the threshold voltage of the transistor by switching a polarization state of the ferroelectric material, so that the ambipolar FET with a modulatable threshold voltage, represented as AMFET, is formed; and 3) forming the CAM cell with the AMFET obtained in step 2);

4) wherein a drain and a gate of the AMFET are used as a ML terminal and a SL terminal of the CAM, respectively, and a source of the AMFET is grounded, wherein in a stage of performing write on the CAM cell to store an entry, the ML terminal is grounded, and programming or erasing voltage pulses are applied to the SL terminal to modulate the threshold voltage of the AMFET by charge trapping/charge de-trapping or ferroelectric polarization switching, so that a translation along a gate voltage is exhibited on a transfer characteristic curve of the device, where the gate voltage corresponding to a minimum drain current is called $V_{OFF}$, and corresponding $V_{OFF0}$ and $V_{OFF1}$ after a programming/erasing operation represent storing of entry 0 and entry 1, respectively; and in a searching operation, DC voltage biases of $V_{SL0}$ and $V_{SL1}$ are applied, representing inputting of query 0 and query 1, respectively, to the SL terminal and a fixed read voltage is applied to the ML terminal to determine a matching result by detecting a current of the ML terminal, wherein only when the input query is identical to the stored entries, the AMFET is in a turn-off state with a lower drain current, indicating match, and when the input query is not identical to the stored entries, the AMFET is in a turn-on state with a higher drain current, indicating mismatch, then the searching operation and the matching operation of a CAM cell is completed.

2. The method for implementing the CAM based on the ambipolar FET according to claim 1, characterized in that the semiconductor material in step 1) is an organic small molecule, a polymer, a two-dimensional material, an oxide, and an organic-inorganic hybrid material.

3. The method for implementing CAM based on the ambipolar FET according to claim 1, characterized in that the ferroelectric material in step 2) is $HfO_2$ doped with Zr (HZO), $HfO_2$ doped with Al (HfAlO), or a chalcocite-type ferroelectric or a ferroelectric polymer.

4. The method for implementing CAM based on the ambipolar FET according to claim 1, characterized in that a gate stack on the gate dielectric layer is based on an MFMIS, MFIS, MFS structure.

5. The method for implementing CAM based on the ambipolar FET according to claim 1, characterized in that the CAM cells form an array, and each row of CAM cells in the array shares a ML, wherein a corresponding search voltage is applied to all of the SL terminals at the same time according to an input vector of the query, and each of rows of MLs for the CAM array has a different magnitude of current according to various mismatch situations between the input vector of query and stored vectors of entries, the magnitude of which is proportional to a degree of the mismatch, and a distance metric is realized according to the magnitude of this current.

* * * * *